US012721063B2

(12) United States Patent
Kagaya et al.

(10) Patent No.: US 12,721,063 B2
(45) **Date of Patent: *Aug. 25, 2026**

(54) METHOD OF FORMING SILICON NITRIDE FILM AND FILM FORMING APPARATUS

(71) Applicant: Tokyo Electron Limited, Tokyo (JP)

(72) Inventors: Munehito Kagaya, Nirasaki City (JP); Yuji Otsuki, Nirasaki City (JP); Yusuke Suzuki, Nirasaki City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 338 days.

This patent is subject to a terminal disclaimer.

(21) Appl. No.: 18/272,938

(22) PCT Filed: Jan. 11, 2022

(86) PCT No.: PCT/JP2022/000545

§ 371 (c)(1), (2) Date: Jul. 18, 2023

(87) PCT Pub. No.: WO2022/158332

PCT Pub. Date: Jul. 28, 2022

(65) Prior Publication Data

US 2024/0087885 A1 Mar. 14, 2024

(30) Foreign Application Priority Data

Jan. 20, 2021 (JP) ................................ 2021-007406

(51) Int. Cl.
*H01L 21/02* (2006.01)
*C23C 16/02* (2006.01)
(Continued)

(52) U.S. Cl.
CPC .......... *H10P 14/6514* (2026.01); *C23C 16/02* (2013.01); *C23C 16/045* (2013.01);
(Continued)

(58) Field of Classification Search
None
See application file for complete search history.

(56) References Cited

U.S. PATENT DOCUMENTS

2022/0119939 A1* 4/2022 Noh ...................... C23C 16/045

FOREIGN PATENT DOCUMENTS

JP 2013-093551 A 5/2013
JP 2014-112668 A 6/2014
(Continued)

*Primary Examiner* — Asok K Sarkar
(74) *Attorney, Agent, or Firm* — Nath, Goldberg & Meyer; Jerald L. Meyer; Tanya E. Harkins

(57) ABSTRACT

A method of forming a silicon nitride film according to an aspect of the present disclosure forms a silicon nitride film in a recess formed in a surface of a substrate. The method includes a process of forming an adsorption-inhibiting region by exposing the substrate to plasma generated from an adsorption-inhibiting gas that contains a halogen gas and a non-halogen gas, a process of adsorbing a silicon-containing gas in a region other than the adsorption-inhibiting region, and a process of forming a silicon nitride film by exposing the substrate, on which the silicon-containing gas has been adsorbed, to plasma generated from a nitrogen-containing gas.

20 Claims, 8 Drawing Sheets

(51) Int. Cl.

| | |
|---|---|
| ***C23C 16/04*** | (2006.01) |
| ***C23C 16/34*** | (2006.01) |
| ***C23C 16/50*** | (2006.01) |
| ***C23C 16/56*** | (2006.01) |
| ***H01J 37/32*** | (2006.01) |
| ***H10P 14/60*** | (2026.01) |
| ***H10P 14/694*** | (2026.01) |

(52) U.S. Cl.

CPC ............ *C23C 16/345* (2013.01); *C23C 16/50* (2013.01); *C23C 16/56* (2013.01); *H01J 37/32449* (2013.01); *H10P 14/6339* (2026.01); *H10P 14/69433* (2026.01); *H01J 2237/2001* (2013.01); *H01J 2237/332* (2013.01)

(56) References Cited

FOREIGN PATENT DOCUMENTS

| | | | |
|---|---|---|---|
| JP | 2018-137369 | A | 8/2018 |
| JP | 2018-186174 | A | 11/2018 |
| KR | 1020130038137 | A | 4/2013 |
| KR | 1020180097154 | A | 8/2018 |

* cited by examiner

METHOD OF FORMING SILICON NITRIDE FILM AND FILM FORMING APPARATUS

This is a National Phase Application filed under 35 U.S.C. 371 as a national stage of PCT/JP2022/000545, filed Jan. 11, 2022, an application claiming the benefit of Japanese Application No. 2021-007406, filed Jan. 20, 2021, the content of each of which is hereby incorporated by reference in its entirety.

TECHNICAL FIELD

The present disclosure relates to a method of forming a silicon nitride film and a film forming apparatus.

BACKGROUND

In a semiconductor manufacturing process, along with the miniaturization of a structure, it is required to embed a film without voids (clearances) in a recess having a high aspect ratio. As an example of a process for embedding a film in a recess, there is known a technique in which deposition and etching are alternately repeated to embed a film from the bottom of the recess in a bottom-up manner (see, for example, Patent Document 1). As another example of a process for embedding a film in a recess, there is known a technique in which an adsorption-inhibiting gas is adsorbed in the vicinity of the opening of the recess to suppress deposition of a film in the vicinity of the opening, thereby embedding the film from the bottom of the recess in a bottom-up manner (see, for example, Patent Document 2).

PRIOR ART DOCUMENTS

Patent Documents

Patent Document 1: Japanese Patent Laid-Open Publication No. 2014-112668

Patent Document 2: Japanese Patent Laid-Open Publication No. 2018-137369

The present disclosure provides a technology capable of embedding a high-quality silicon nitride film in a recess.

SUMMARY

A method for forming a silicon nitride film according to an aspect of the present disclosure forms a silicon nitride film in a recess formed in a surface of a substrate. The method includes: a process of forming an adsorption-inhibiting region by exposing the substrate to plasma generated from an adsorption-inhibiting gas that contains a halogen gas and a non-halogen gas; a process of adsorbing a silicon-containing gas in a region other than the adsorption-inhibiting region; and a process of forming a silicon nitride film by exposing the substrate, on which the silicon-containing gas has been adsorbed, to plasma generated from a nitrogen-containing gas.

According to the present disclosure, a high-quality silicon nitride film can be embedded in a recess.

DETAILED DESCRIPTION

Figure 1:
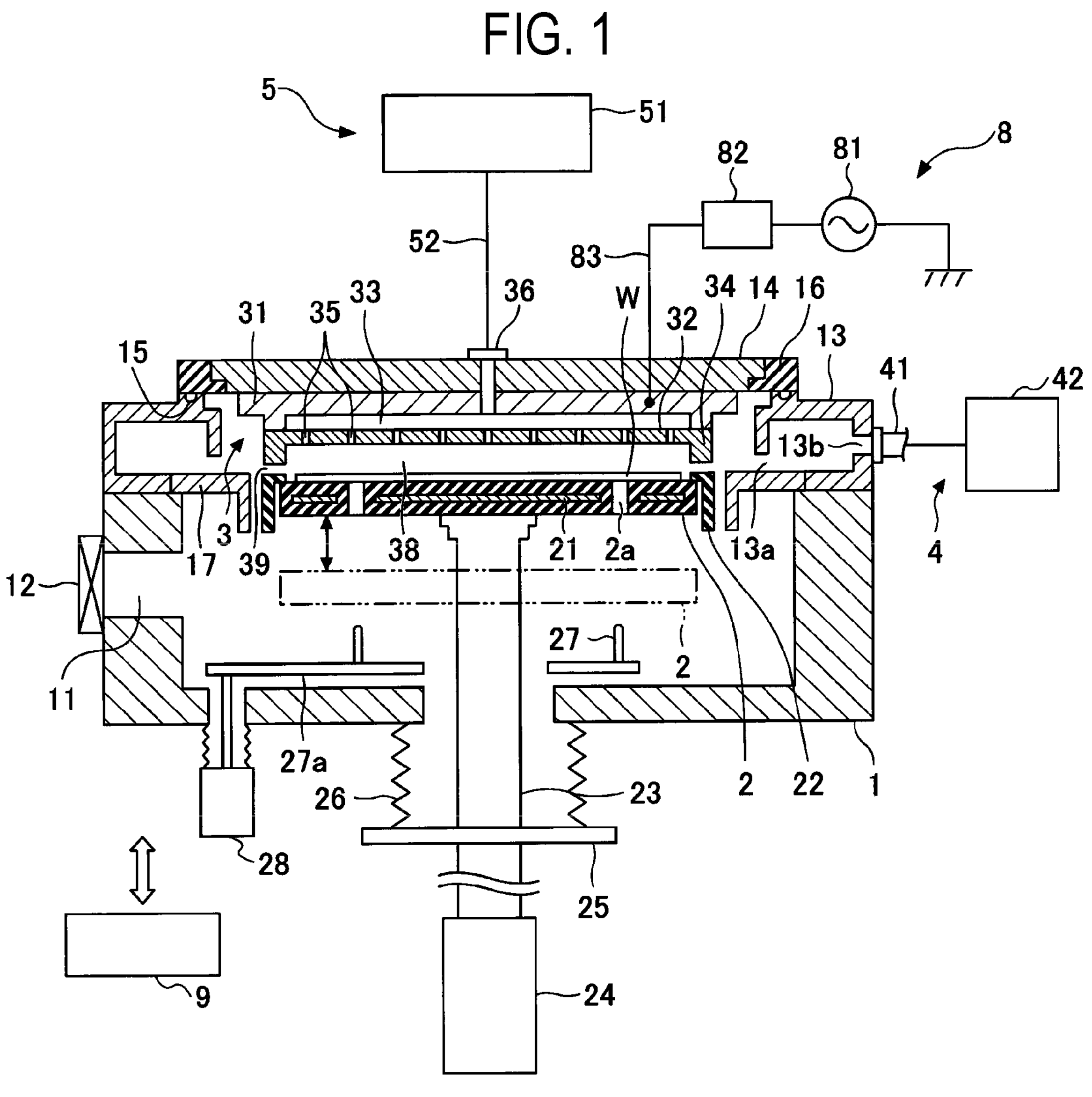
FIG. 1 is a schematic cross-sectional view illustrating an example of a film forming apparatus according to an embodiment.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant descriptions will be omitted.

[Film Forming Apparatus]

An example of a film forming apparatus of an embodiment will be described with reference to FIG. 1. The film forming apparatus includes a processing container 1, a stage 2, a shower head 3, an exhauster 4, a gas supplier 5, an RF power supply 8, a controller 9, and the like.

The processing container 1 is made of a metal such as aluminum, and has a substantially cylindrical shape. A wafer W as an example of a substrate is accommodated in the processing container 1. A carry-in/out port 11 is formed in a side wall of the processing container 1 for carry-in or carry-out of the wafer W. The carry-in/out port 11 is opened/closed by a gate valve 12. An annular exhaust duct 13 having a rectangular cross section is provided on the main body of the processing container 1. A slit 13*a* is formed along the inner peripheral surface of the exhaust duct 13. An exhaust port 13*b* is formed in the outer wall of the exhaust duct 13. On the top surface of the exhaust duct 13, a ceiling wall 14 is provided to close the upper opening of the processing container 1 via an insulating member 16. A space between the exhaust duct 13 and the insulating member 16 is hermetically sealed with a seal ring 15. A partition member 17 divides the interior of the processing container 1 into upper and lower portions when the stage 2 (and a cover member 22) is raised to a processing position.

The stage 2 horizontally supports the wafer W within the processing container 1. The stage 2 is formed in a disk shape having a size corresponding to the wafer W and supported by a support member 23. The stage 2 is formed of a ceramic material such as AlN or a metal material such as aluminum or a nickel alloy, and a heater 21 configured to heat the wafer W is embedded in the stage 2. The heater 21 generates heat by being fed with power from a heater power supply (not illustrated). Then, the wafer W is controlled to a predetermined temperature by controlling the output of the heater 21 by a temperature signal of a thermocouple (not illustrated) provided in the vicinity of the top surface of the stage 2. The stage 2 is provided with a cover member 22 formed of ceramics such as alumina to cover the outer peripheral region of the top surface and the side surface thereof.

A support member 23 configured to support the stage 2 is provided on a bottom surface of the stage 2. The support member 23 extends to the lower side of the processing container 1 through a hole formed in the bottom wall of the processing container 1 from the center of the bottom surface of the stage 2, and the lower end of the support member 23 is connected to a lifting mechanism 24. The stage 2 is raised and lowered via the support member 23 by the lifting mechanism 24 between a processing position illustrated in FIG. 1 and a transport position at which the wafer W is transportable, wherein the transport position is indicated by an alternate long and two short dashes line below the processing position. Below the processing container 1, a flange 25 is mounted on the support member 23. A bellows 26 is provided between the bottom surface of the processing container 1 and the flange 25. The bellows 26 partitions the atmosphere in the processing container 1 from the external air, and expands and contracts in response to the raised/lowered movement of the stage 2.

Three wafer support pins 27 (of which only two are illustrated) are provided in the vicinity of the bottom surface of the processing container 1 to protrude upward from a lifting plate 27*a*. The wafer support pins 27 are raised and lowered through the lifting plate 27*a* by the lifting mechanism 28 provided below the processing container 1. The wafer support pins 27 are inserted through the through holes 2*a* provided in the stage 2 located at the transport position and are configured to protrude and retract with respect to the top surface of the stage 2. By raising/lowering the wafer support pins 27, the wafer W is delivered between a wafer transport mechanism (not illustrated) and the stage 2.

The shower head 3 supplies a processing gas into the processing container 1 in a shower form. The shower head 3 is made of a metal, is provided to face the stage 2, and has a diameter that is substantially the same as that of the stage 2. The shower head 3 includes a main body 31 and a shower plate 32. The main body 31 is fixed to the ceiling wall 14 of the processing container 1. The shower plate 32 is connected under the main body 31. A gas diffusion space 33 is formed between the main body 31 and the shower plate 32. The gas diffusion space 33 is provided with a gas introduction hole 36 which penetrates the centers of the ceiling wall 14 of the processing container 1, and the main body 31. An annular protrusion 34 protruding downward is formed on the peripheral edge of the shower plate 32. Gas ejection holes 35 are formed in a flat portion inside the annular protrusion 34. In the state in which the stage 2 is present at the processing position, a processing space 38 is formed between the stage 2 and the shower plate 32, and the top surface of the cover member 22 and the annular protrusion 34 are close to each other to form an annular gap 39 therebetween.

The exhauster 4 evacuates the interior of the processing container 1. The exhauster 4 includes an exhaust pipe 41 connected to the exhaust port 13*b*, and an exhaust mechanism 42 connected to the exhaust pipe 41 and including a vacuum pump, a pressure control valve, or the like. During the processing, the gas in the processing container 1 reaches the exhaust duct 13 via the slit 13*a*, and is exhausted from the exhaust duct 13 through the exhaust pipe 41 by the exhaust mechanism 42.

The gas supplier 5 supplies various types of processing gases to the shower head 3. The gas supplier 5 includes a gas source 51, a gas line 52, and the like. The gas source 51 includes various processing gas sources, mass flow controllers, and valves (none of which are illustrated). Various processing gases include an adsorption-inhibiting gas, a silicon-containing gas, a nitrogen-containing gas, a modifying gas, and a purge gas, which are used in the method of forming a silicon nitride film according to embodiments to be described later. The various gases are introduced from the gas source 51 into the gas diffusion space 33 via the gas line 52 and the gas introduction hole 36.

The adsorption-inhibiting gas contains a halogen gas and a non-halogen gas. Examples of the halogen gas include fluorine gas ($F_2$), chlorine gas ($Cl_2$), and hydrogen fluoride gas (HF). Examples of the non-halogen gas include nitrogen gas ($N_2$) and a silane coupling agent. Examples of the silicon-containing gas include gases containing halogens, such as chlorine (Cl), bromine (Br), and iodine (I), and silicon (Si). Examples of the nitrogen-containing gas include ammonia gas ($NH_3$) and hydrazine gas ($N_2H_4$). Examples of the modifying gas include hydrogen gas ($H_2$). Examples of the purge gas include nitrogen gas ($N_2$) and argon gas (Ar).

The film forming apparatus is a capacitively coupled plasma apparatus, in which the stage 2 functions as a lower electrode and the shower head 3 functions as an upper electrode. The stage 2 is grounded via a capacitor (not illustrated). However, the stage 2 may be grounded without, for example, via a capacitor, or may be grounded via a circuit in which a capacitor and a coil are combined. The shower head 3 is connected to the RF power supply 8.

The RF power supply 8 supplies radio frequency power (hereinafter, also referred to as "RF power") to the shower head 3. The RF power supply 8 includes an RF power source 81, a matcher 82, and a feeding line 83. The RF power source 81 is a power source that generates RF power. The RF power has a frequency suitable for plasma generation. The frequency of the RF power is, for example, a frequency in the range of 450 KHz in a low-frequency band to 2.45 GHz in the microwave band. The RF power source 81 is connected to the main body 31 of the shower head 3 via the matcher 82 and the feeding line 83. The matcher 82 has a circuit configured to match a load impedance with the internal impedance of the RF power source 81. The RF power supply 8 has been described as supplying RF power to the shower head 3 which serves as the upper electrode, but the disclosure is not limited thereto. RF power may be supplied to the stage 2 which serves as the lower electrode.

The controller 9 is, for example, a computer and includes a central processing unit (CPU), a random-access memory (RAM), a read only memory (ROM), an auxiliary memory, and the like. The CPU operates based on a program stored in the ROM or an auxiliary storage device, and controls the operation of the film forming apparatus. The controller 9 may be provided either inside or outside the film forming apparatus. In the case where the controller 9 is provided outside the film forming apparatus, the controller 9 may control the film forming apparatus via a wired or wireless communication mechanism.

[Method of Forming Silicon Nitride Film]

A case where an example of a method of forming a silicon nitride film according to an embodiment is performed by using the above-described film forming apparatus will be described with reference to FIG. 2. In the present embodiment, a silicon wafer is used as the wafer W, and a trench is formed in the silicon wafer as a recess. In addition, the inner portion of the trench and the surface of the wafer W are made of, for example, silicon or an insulating film, and a metal or a metal compound may be partially present therein.

First, the controller 9 carries a wafer W having a trench formed in the surface thereof into the processing container 1. The controller 9 controls the lifting mechanism 24 to open the gate valve 12 in the state in which the stage 2 is lowered to the transport position. Subsequently, by a transport arm (not illustrated), the wafer W is carried into the processing container 1 through the carry-in/out port 11 and placed on the stage 2 heated to a predetermined temperature (e.g., 600 degrees C. or lower) by the heater 21. Subsequently, the controller 9 controls the lifting mechanism 24 to raise the stage 2 to the processing position, and depressurizes the interior of the processing container 1 to a predetermined degree of vacuum by the exhaust mechanism 42.

Subsequently, a $Cl_2$ plasma process S11 is performed as a process of forming an adsorption-inhibiting region. In the $Cl_2$ plasma process S11, the wafer W is exposed to plasma generated from chlorine gas to form an adsorption-inhibiting region in the upper portion of the trench and on the surface of the wafer W. In the present embodiment, the controller 9 supplies chlorine gas from the gas supplier 5 into the processing container 1 through the shower head 3, and then supplies RF power to the shower head 3 from the RF power supply 8. As a result, plasma is generated from the chlorine gas in the processing container 1, and active species (reactive species) such as chlorine radicals and chlorine ions are supplied to the surface of the trench formed in the wafer W. The active species are physically or chemically adsorbed on the surface. Since the adsorbed chlorine has a function of inhibiting the adsorption of DCS in a Si precursor adsorption process S15, which will be described later, the region where the chlorine has been adsorbed becomes an adsorption-inhibiting region for the DCS. Here, the active species easily reach the surface of the wafer W or the upper portion in the trench, but do not reach so much the inner portion of the trench, that is, the lower portion near the bottom portion. Due to the high aspect ratio of the trench, many active species are adsorbed or deactivated before reaching the inner portion of the trench. Therefore, chlorine is adsorbed at a high density on the surface of the wafer W and the upper portion of the trench, but in the lower portion of the trench, many unadsorbed portions remain and the density of the adsorbed chlorine becomes low.

The RF power in the $Cl_2$ plasma process S11 is preferably smaller than the RF power in a nitriding process S17 to be described later. This is because, in the $Cl_2$ plasma process S11, it is necessary to relatively limit a dose amount of active species in order to form an adsorbed chlorine density gradient inside the trench, whereas, in the nitriding process S17, the entire film inside the trench is necessary to be sufficiently nitrided.

The process conditions in the $Cl_2$ plasma process S11 are, for example, as follows.

Time: 0.05 seconds to 6 seconds

RF power: 10 W to 500 W

Pressure: 0.1 Torr (13.3 Pa) to 50 Torr (6.7 kPa)

Subsequently, a purge process S12 is performed. In the purge process S12, the gas remaining in the processing container 1 after the $Cl_2$ plasma process S11 is removed. In the present embodiment, the controller 9 supplies argon gas from the gas supplier 5 into the processing container 1 through the shower head 3 and evacuates the interior of the processing container 1 by the exhauster 4. As a result, the gas remaining in the processing container 1 is discharged together with the argon gas. The purge process S12 may be omitted.

Subsequently, a $N_2$ plasma process S13 is performed as a process of forming an adsorption-inhibiting region. In the $N_2$ plasma process S13, the wafer W is exposed to plasma generated from nitrogen gas to form an adsorption-inhibiting region in the upper portion of the trench and on the surface of the wafer W. In the present embodiment, the controller 9 supplies nitrogen gas from the gas supplier 5 into the processing container 1 through the shower head 3, and then supplies RF power to the shower head 3 from the RF power supply 8. As a result, plasma is generated from the nitrogen gas within the processing container 1, and active species, such as nitrogen radicals and nitrogen ions, are supplied into the trench formed in the surface of the wafer W. The active species are physically adsorbed or chemically adsorbed to sites where chlorine is not adsorbed in the $Cl_2$ plasma process S11. Since the adsorbed nitrogen has a function of inhibiting the adsorption of DCS in a Si precursor adsorption process S15, which will be described later, the region where the nitrogen has been adsorbed becomes an adsorption-inhibiting region for the DCS. Here, the active species easily reach the surface of the wafer W or the upper portion in the trench, but do not reach so much the inner portion of the trench, that is, the lower portion near the bottom portion. Due to the high aspect ratio of the trench, many active species are adsorbed or deactivated before reaching the inner portion of the trench. Therefore, nitrogen is adsorbed at a high density on the surface of the wafer W and the upper portion of the trench, but in the lower portion of the trench, many unadsorbed portions remain and the density of the adsorbed nitrogen becomes low.

The RF power in the $N_2$ plasma process S13 is preferably smaller than the RF power in the nitriding process S17 to be described later. This is because, in the $N_2$ plasma process S13, it is necessary to relatively limit a dose amount of active species in order to form an adsorbed nitrogen density gradient inside the trench, whereas in the nitriding process S17, it is necessary that the entire film inside the trench is sufficiently nitrided.

The process conditions in the $N_2$ plasma process S13 are, for example, as follows.

Time: 0.1 seconds to 6 seconds

RF power: 10 W to 1 kW

Pressure: 0.1 Torr (13.3 Pa) to 50 Torr (6.7 kPa)

Subsequently, a purge process S14 is performed. In the purge process S14, the gas remaining in the processing container 1 after the $N_2$ plasma process S13 is removed. In the present embodiment, the controller 9 supplies argon gas from the gas supplier 5 into the processing container 1 through the shower head 3 and evacuates the interior of the processing container 1 by the exhauster 4. As a result, the gas remaining in the processing container 1 is discharged together with the argon gas. The purge process S14 may be omitted.

Subsequently, a Si precursor adsorption process S15 is performed. In the Si precursor adsorption process S15, by supplying DCS to the wafer W, the DCS is adsorbed on a region other than the adsorption-inhibiting region, thereby forming a Si-containing layer. In the present embodiment, the controller 9 supplies the DCS from the gas supplier 5 into the processing container 1 via the shower head 3. The DCS is not adsorbed so much in a region where adsorbed chlorine and adsorbed nitrogen having an adsorption-inhibiting function are present, but is adsorbed more in an area where adsorption-inhibiting groups are not present. Therefore, a lot of DCS is adsorbed near the bottom of the trench, and less DCS is adsorbed on the surface of the wafer W and the upper portion of the trench. In other words, the DCS is adsorbed at a high density near the bottom of the trench, and the DCS is adsorbed at a low density in the upper portion of the trench and on the surface of the wafer W.

Subsequently, a purge process S16 is performed. In the purge process S16, the gas remaining in the processing container 1 after the Si precursor adsorption process S15 is removed. In the present embodiment, the controller 9 supplies argon gas from the gas supplier 5 into the processing container 1 through the shower head 3 and evacuates the interior of the processing container 1 by the exhauster 4. As a result, the gas remaining in the processing container 1 is discharged together with the argon gas. The purge process S16 may be omitted.

Subsequently, a nitriding process S17 is performed. In the nitriding process S17, the wafer W is exposed to plasma generated from ammonia gas and the Si-containing layer formed on the surface of the wafer W and in the trench is nitrided to form a silicon nitride film. In the present embodiment, the controller 9 supplies ammonia gas from the gas supplier 5 into the processing container 1 through the shower head 3, and then supplies RF power to the shower head 3 from the RF power supply 8. As a result, in the processing container 1, plasma is generated from the ammonia gas, and active species for nitriding are supplied to the surface of the wafer W and into the trench. The active species react with the Si-containing layer formed in the trench, and a molecular layer of a silicon nitride film is formed as a reaction product. Here, since a large amount of the Si-containing layer is formed near the bottom of the trench, a large amount of the silicon nitride film is formed near the bottom of the trench. Therefore, embedded film formation with a high bottom-up property is possible.

The process conditions in the nitriding process S17 are, for example, as follows.

Time: 1 second to 10 seconds

RF power: 100 W to 3 kW

Pressure: 0.1 Torr (13.3 Pa) to 50 Torr (6.7 kPa)

Subsequently, a purge process S18 is performed. In the purge process S18, the gas remaining in the processing container 1 after the nitriding process S17 is removed. In the present embodiment, the controller 9 supplies argon gas from the gas supplier 5 into the processing container 1 through the shower head 3 and evacuates the interior of the processing container 1 by the exhauster 4. As a result, the gas remaining in the processing container 1 is discharged together with the argon gas. The purge process S18 may be omitted.

Subsequently, a determination process S19 is performed. In the determination process S19, the controller 9 determines whether the number of repetitions of the processes from the $Cl_2$ plasma process S11 to the purge process S18 reaches a set number of times. The set number of times is determined depending on, for example, the thickness of a silicon nitride film to be formed. When it is determined in the determination process S19 that the number of repetitions reaches the set number of times, processing is terminated. On the other hand, when it is determined in the determination process S19 that the number of repetitions has not reached the set number of times, the operation returns to the $Cl_2$ plasma process S11.

In this manner, the processes from the $Cl_2$ plasma process S11 to the purge process S18 are repeated, and a silicon nitride film is deposited from the bottom side in a state in which the opening of the trench is not blocked. Then, while forming a V-shaped cross section, a silicon nitride film can be formed with a high bottom-up property that does not block the opening. As a result, a high-quality silicon nitride film can be embedded in a trench without generating a void.

Next, another example of a method of forming a silicon nitride film according to an embodiment will be described with reference to FIG. 3. The method illustrated in FIG. 3 differs from the method illustrated in FIG. 2 in that a wafer W is exposed to plasma generated from chlorine gas and nitrogen gas to form an adsorption-inhibiting region in the upper portion of the trench and on the surface of the wafer W. In other points, the method is the same as the method illustrated in FIG. 2. Therefore, the points different from the method illustrated in FIG. 2 will be mainly described below.

First, the controller 9 carries a wafer W having a trench formed in the surface thereof into the processing container 1. The method of carrying the wafer W into the processing container 1 may be the same as the method illustrated in FIG. 2.

Subsequently, a $Cl_2/N_2$ plasma process S21 is performed as a process of forming an adsorption-inhibiting region. In the $Cl_2/N_2$ plasma process S21, the wafer W is exposed to plasma generated from chlorine gas and nitrogen gas to form an adsorption-inhibiting region in the upper portion of the trench and on the surface of the wafer W. In the present embodiment, the controller 9 simultaneously supplies chlorine gas and nitrogen gas from the gas supplier 5 into the processing container 1 through the shower head 3, and then supplies RF power to the shower head 3 from the RF power supply 8. As a result, plasma is generated from the chlorine gas and the nitrogen gas in the processing container 1, and active species are supplied into the trench formed in the surface of the wafer W. The active species are physically or chemically adsorbed on the surface. Since the adsorbed chlorine has a function of inhibiting the adsorption of DCS in a Si precursor adsorption process S23, which will be described later, the region where the chlorine has been adsorbed becomes an adsorption-inhibiting region for the DCS. In addition, nitrogen is also physically or chemically adsorbed on the surface similarly to the chlorine. Since the adsorbed nitrogen has a function of inhibiting the adsorption of DCS in the Si precursor adsorption process S23, which will be described later, the region where the nitrogen has been adsorbed becomes an adsorption-inhibiting region for the DCS. Here, the active species easily reach the surface of the wafer W or the upper portion in the trench, but do not reach so much the inner portion of the trench, that is, the lower portion near the bottom portion. Due to the high aspect ratio of the trench, many active species are adsorbed or deactivated before reaching the inner portion of the trench. Therefore, chlorine and nitrogen are adsorbed at a high density on the surface of the wafer W and the upper portion of the trench, but in the lower portion of the trench, many unadsorbed portions remain and the density of the adsorbed chlorine and the adsorbed nitrogen becomes low.

The RF power in the $Cl_2/N_2$ plasma process S21 is preferably smaller than the RF power in a nitriding process S25. This is, in contrast to forming a gradient of adsorption densities of chlorine and nitrogen inside the trench in the $Cl_2/N_2$ plasma process S21, for sufficiently nitriding the entire film inside the trench in the nitriding process S25.

In addition, the process conditions in the $Cl_2/N_2$ plasma process S21 may be the same as, for example, those in the $Cl_2$ plasma process S11 or the $N_2$ plasma process S13.

Subsequently, a purge process S22, a Si precursor adsorption process S23, a purge process S24, a nitriding process S25, a purge process S26, and a determination process S27 are performed in this order. The purge process S22, the Si precursor adsorption process S23, the purge process S24, the nitriding process S25, the purge process S26, and the determination process S27 may be the same as the purge process S14, the Si precursor adsorption process S15, the purge process S16, the nitriding process S17, the purge process S18, and the determination process S19 illustrated in FIG. 2.

In this manner, the processes from the $Cl_2/N_2$ plasma process S21 to the purge process S26 are repeated, and a silicon nitride film is deposited from the bottom side in a state in which the opening of the trench is not blocked. Then, while forming a V-shaped cross section, a silicon nitride film can be formed with a high bottom-up property that does not block the opening. As a result, a high-quality silicon nitride film can be embedded in a trench without generating a void.

Next, another example of a method of forming a silicon nitride film according to an embodiment will be described with reference to FIG. 4. The method illustrated in FIG. 4 differs from the method illustrated in FIG. 2 in that a wafer W is exposed to plasma generated from chlorine gas and nitrogen gas and then exposed to plasma generated from nitrogen gas to form an adsorption-inhibiting region in the upper portion of the trench and on the surface of the wafer W. In other points, the method is the same as the method illustrated in FIG. 2. Therefore, the points different from the method illustrated in FIG. 2 will be mainly described below.

First, the controller 9 carries a wafer W having a trench formed in the surface thereof into the processing container 1. The method of carrying the wafer W into the processing container 1 may be the same as the method illustrated in FIG. 2.

Subsequently, a $Cl_2/N_2$ plasma process S31 is performed. In the $Cl_2/N_2$ plasma process S31, the wafer W is exposed to plasma generated from chlorine gas and nitrogen gas to form an adsorption-inhibiting region in the upper portion of the trench and on the surface of the wafer W. In the present embodiment, the controller 9 simultaneously supplies chlorine gas and nitrogen gas from the gas supplier 5 into the processing container 1 through the shower head 3, and then supplies RF power to the shower head 3 from the RF power supply 8. As a result, plasma is generated from the chlorine gas and the nitrogen gas in the processing container 1, and active species are supplied onto a base film in the trench formed in the surface of the wafer W. The active species are physically or chemically adsorbed on the surface. Since the adsorbed chlorine has a function of inhibiting the adsorption of DCS in a Si precursor adsorption process S34, which will be described later, the region where the chlorine has been adsorbed becomes an adsorption-inhibiting region for the DCS. In addition, nitrogen is also physically or chemically adsorbed on the surface similarly to the chlorine. Since the adsorbed nitrogen has a function of inhibiting the adsorption of DCS in the Si precursor adsorption process S34, which will be described later, the region where the nitrogen has been adsorbed becomes an adsorption-inhibiting region for the DCS. Here, the active species easily reach the surface of the wafer W or the upper portion in the trench, but do not reach so much the inner portion of the trench, that is, the lower portion near the bottom portion. Due to the high aspect ratio of the trench, many active species are adsorbed or deactivated before reaching the inner portion of the trench. Therefore, chlorine and nitrogen are adsorbed at a high density on the surface of the wafer W and the upper portion of the trench, but in the lower portion of the trench, many unadsorbed portions remain and the density of the adsorbed chlorine and the adsorbed nitrogen becomes low.

The RF power in the $Cl_2/N_2$ plasma process S31 is preferably smaller than the RF power in a nitriding process S36. This is, in contrast to forming a gradient of adsorption densities of chlorine and nitrogen inside the trench in the $Cl_2/N_2$ plasma process S31, for sufficiently nitriding the entire film inside the trench in the nitriding process S36.

In addition, the process conditions in the $Cl_2/N_2$ plasma process S31 may be the same as, for example, those in the $Cl_2$ plasma process S11 or the $N_2$ plasma process S13.

Subsequently, a $N_2$ plasma process S32 is performed. In the $N_2$ plasma process S32, the wafer W is exposed to plasma generated from nitrogen gas to form an adsorption-inhibiting region in the upper portion of the trench and on the surface of the wafer W. In the present embodiment, the controller 9 supplies nitrogen gas from the gas supplier 5 into the processing container 1 through the shower head 3, and supplies RF power to the shower head 3 from the RF power supply 8. As a result, plasma is generated from the nitrogen gas in the processing container 1, and active species are supplied onto the base film in the trench formed in the surface of the wafer W. The active species are physically adsorbed or chemically adsorbed to sites where chlorine and nitrogen are not adsorbed in the $Cl_2/N_2$ plasma process S31. Since the adsorbed nitrogen has a function of inhibiting the adsorption of DCS in a Si precursor adsorption process S34, which will be described later, the region where the nitrogen has been adsorbed becomes an adsorption-inhibiting region for the DCS. Here, the active species easily reach the surface of the wafer W or the upper portion in the trench, but do not reach so much the inner portion of the trench, that is, the lower portion near the bottom portion. Due to the high aspect ratio of the trench, many active species are adsorbed or deactivated before reaching the inner portion of the trench. Therefore, nitrogen is adsorbed at a high density on the surface of the wafer W and the upper portion of the trench, but in the lower portion of the trench, many unadsorbed portions remain and the density of the adsorbed nitrogen becomes low.

The RF power in the $N_2$ plasma process S32 is preferably smaller than the RF power in the nitriding process S36. This is, in contrast to forming a gradient of adsorption density of nitrogen inside the trench in the $N_2$ plasma process S32, for sufficiently nitriding the entire film inside the trench in the nitriding process S36.

In addition, the process conditions in the $N_2$ plasma process S32 may be the same as, for example, the process conditions in the $N_2$ plasma process S13.

In addition, when proceeding from the $Cl_2/N_2$ plasma process S31 to the $N_2$ plasma process S32, the $N_2$ plasma process S32 may be performed, for example, after stopping only the supply of the chlorine gas in the state in which the supply of the RF power is maintained. In addition, when proceeding from the $Cl_2/N_2$ plasma process S31 to the $N_2$ plasma process S32, the $N_2$ plasma process S32 may be performed, for example, after temporarily stopping the supply of the RF power, the supply of the chlorine gas, and the supply of the nitrogen gas. In addition, when proceeding from the $Cl_2/N_2$ plasma process S31 to the $N_2$ plasma process S32, the $N_2$ plasma process S32 may be performed, for example, after temporarily stopping the supply of the RF power and the supply of the chlorine gas and maintaining the state of supplying the nitrogen gas for a predetermined period of time.

In addition, for example, a purge process may be performed between the $Cl_2/N_2$ plasma process S31 and the $N_2$ plasma process S32.

Subsequently, a purge process S33, a Si precursor adsorption process S34, a purge process S35, a nitriding process S36, a purge process S37, and a determination process S38 are performed in this order. The purge process S33, the Si precursor adsorption process S34, the purge process S35, the nitriding process S36, the purge process S37, and the determination process S38 may be the same as the purge process S14, the Si precursor adsorption process S15, the purge process S16, the nitriding process S17, the purge process S18, and the determination process S19 illustrated in FIG. 2.

In this manner, the processes from the $Cl_2/N_2$ plasma process S31 to the purge process S37 are repeated, and a silicon nitride film is deposited from the bottom side in a state in which the opening of the trench is not blocked. Then, a silicon nitride film can be formed with a high bottom-up property without blocking the opening while forming a V-shaped cross section. As a result, a high-quality silicon nitride film can be embedded in a trench without generating a void.

Next, another example of a method of forming a silicon nitride film according to an embodiment will be described with reference to FIG. 5. The method illustrated in FIG. 5 differs from the method illustrated in FIG. 4 in that a $Cl_2$ plasma process S42 is performed instead of the $N_2$ plasma process S32. In other points, the method is the same as the method illustrated in FIG. 4. Therefore, the points different from the method illustrated in FIG. 4 will be mainly described below.

First, the controller 9 carries a wafer W having a trench formed in the surface thereof into the processing container 1. The method of carrying the wafer W into the processing container 1 may be the same as the method illustrated in FIG. 2.

Subsequently, a $Cl_2/N_2$ plasma process S41 is performed. The $Cl_2/N_2$ plasma process S41 may be the same as the $Cl_2/N_2$ plasma process S31.

Subsequently, a $Cl_2$ plasma process S42 is performed. In the $Cl_2$ plasma process S42, the wafer W is exposed to plasma generated from chlorine gas to form an adsorption-inhibiting region in the upper portion of the trench and on the surface of the wafer W. In the present embodiment, the controller 9 supplies chlorine gas from the gas supplier 5 into the processing container 1 through the shower head 3, and then supplies RF power to the shower head 3 from the RF power supply 8. As a result, plasma is generated from the chlorine gas in the processing container 1, and active species are supplied onto a base film in the trench formed in the surface of the wafer W. The active species are physically adsorbed or chemically adsorbed to sites where chlorine and nitrogen are not adsorbed in the $Cl_2/N_2$ plasma process S41. Since the adsorbed chlorine has a function of inhibiting the adsorption of DCS in a Si precursor adsorption process S44, which will be described later, the region where the chlorine has been adsorbed becomes an adsorption-inhibiting region for the DCS. Here, the active species easily reach the surface of the wafer W or the upper portion in the trench, but do not reach so much the inner portion of the trench, that is, the lower portion near the bottom portion. Due to the high aspect ratio of the trench, many active species are adsorbed or deactivated before reaching the inner portion of the trench. Therefore, chlorine is adsorbed at a high density on the surface of the wafer W and the upper portion of the trench, but in the lower portion of the trench, many unadsorbed portions remain and the density of the adsorbed chlorine becomes low.

The RF power in the $Cl_2$ plasma process S42 is preferably smaller than the RF power in the nitriding process S46. This is, in contrast to forming a gradient of adsorption density of chlorine inside the trench in the $Cl_2$ plasma process S42, for sufficiently nitriding the entire film inside the trench in the nitriding process S46.

In addition, the process conditions in the $Cl_2$ plasma process S42 may be the same as, for example, the process conditions in the $Cl_2$ plasma process S11.

In addition, when proceeding from the $Cl_2/N_2$ plasma process S41 to the $Cl_2$ plasma process S42, the $Cl_2$ plasma process S42 may be performed, for example, after stopping only the supply of the nitrogen gas in the state in which the supply of the RF power is maintained. In addition, when proceeding from the $Cl_2/N_2$ plasma process S41 to the $Cl_2$ plasma process S42, the $Cl_2$ plasma process S42 may be performed, for example, after temporarily stopping the supply of the RF power, the supply of the chlorine gas, and the supply of the nitrogen gas. In addition, when proceeding from the $Cl_2/N_2$ plasma process S41 to the $Cl_2$ plasma process S42, the $Cl_2$ plasma process S42 may be performed, for example, after temporarily stopping the supply of the RF power and the supply of the nitrogen gas and maintaining the state of supplying the chlorine gas for a predetermined period of time.

In addition, for example, a purge process may be performed between the $Cl_2/N_2$ plasma process S41 and the $Cl_2$ plasma process S42.

Subsequently, a purge process S43, a Si precursor adsorption process S44, a purge process S45, a nitriding process S46, a purge process S47, and a determination process S48 are performed in this order. The purge process S43, the Si precursor adsorption process S44, the purge process S45, the nitriding process S46, the purge process S47, and the determination process S48 may be the same as the purge process S33, the Si precursor adsorption process S34, the purge process S35, the nitriding process S36, the purge process S37, and the determination process S38 illustrated in FIG. 4.

In this manner, the processes from the $Cl_2/N_2$ plasma process S41 to the purge process S47 are repeated, and a silicon nitride film is deposited from the bottom side in a state in which the opening of the trench is not blocked. Then, a silicon nitride film can be formed with a high bottom-up property without blocking the opening while forming a V-shaped cross section. As a result, a high-quality silicon nitride film can be embedded in a trench without generating a void.

Figure 6:
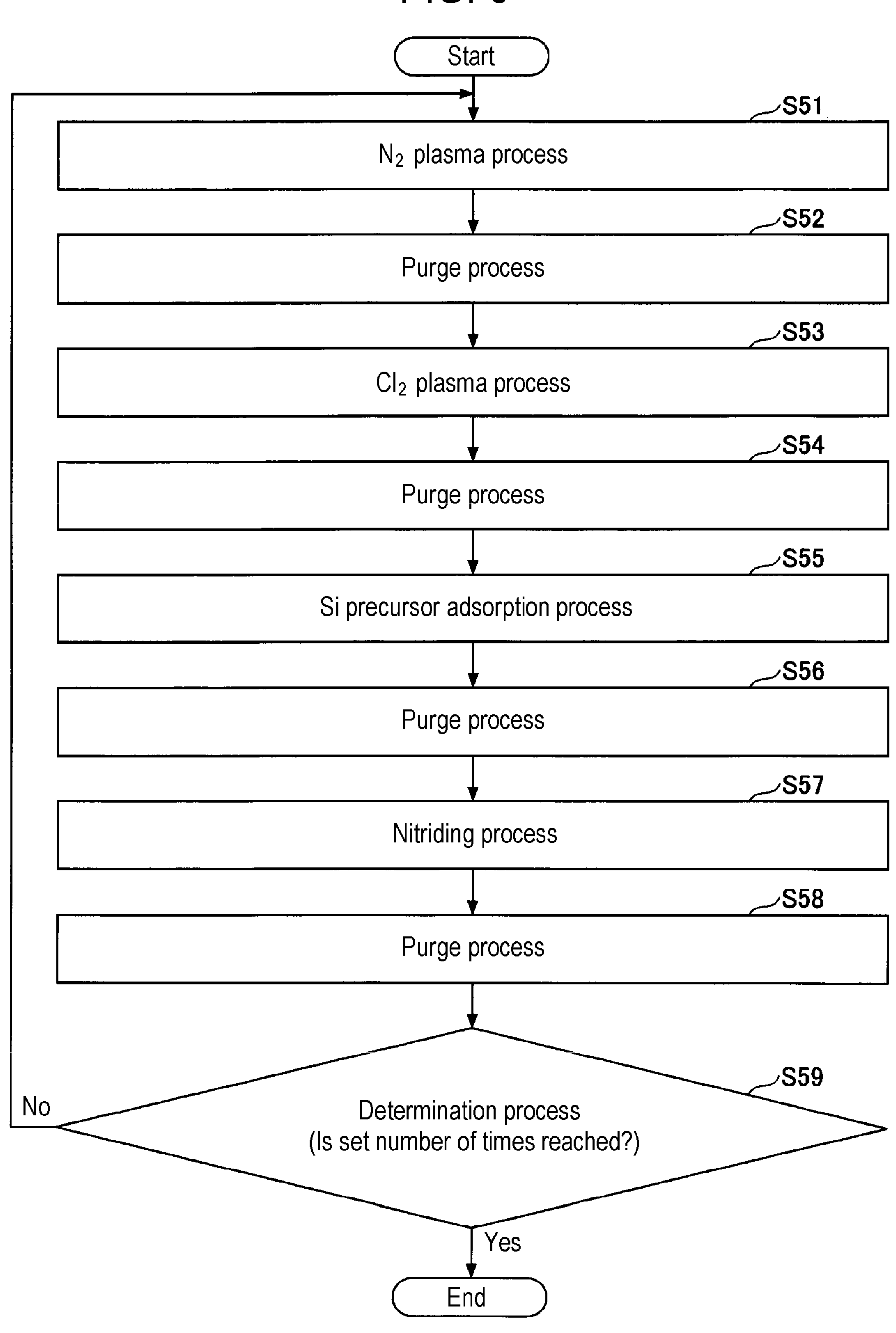
FIG. 6 is a flowchart illustrating yet another example of a method of forming a silicon nitride film according to an embodiment.

Next, another example of a method of forming a silicon nitride film according to an embodiment will be described with reference to FIG. 6. The method illustrated in FIG. 6 differs from the method illustrated in FIG. 2 in that a wafer W is exposed to plasma generated from nitrogen gas and then exposed to plasma generated from chlorine gas to form an adsorption-inhibiting region in the upper portion of the trench and on the surface of the wafer W. In other points, the method is the same as the method illustrated in FIG. 2.

First, the controller 9 carries a wafer W having a trench formed in the surface thereof into the processing container 1. The method of carrying the wafer W into the processing container 1 may be the same as the method illustrated in FIG. 2.

Subsequently, a $N_2$ plasma process S51, a purge process S52, a $Cl_2$ plasma process S53, a purge process S54, a Si precursor adsorption process S55, a purge process S56, a nitriding process S57, a purge process S58, and a determination process S59 are performed in this order. The $N_2$ plasma process S51, the purge process S52, the $Cl_2$ plasma process S53, the purge process S54, the Si precursor adsorption process S55, the purge process S56, the nitriding process S57, the purge process S58, and the determination process S59 may be the same as the $N_2$ plasma process S13, the purge process S12, the $Cl_2$ plasma process S11, the purge process S14, the Si precursor adsorption process S15, the purge process S16, the nitriding process S17, the purge process S18, and the determination process S19 illustrated in FIG. 2.

In this manner, the processes from the $N_2$ plasma process S51 to the purge process S58 are repeated, and a silicon nitride film is deposited from the bottom side in a state in which the opening of the trench is not blocked. Then, a silicon nitride film can be formed with a high bottom-up property without blocking the opening while forming a V-shaped cross section. As a result, a high-quality silicon nitride film can be embedded in a trench without generating a void.

Although the processes of forming various adsorption-inhibiting regions have been described above with reference to FIGS. 2 to 6, the disclosure is not limited thereto. For example, the $Cl_2/N_2$ plasma process may be performed after performing the $Cl_2$ plasma process, or the $Cl_2/N_2$ plasma process may be performed after performing the $N_2$ plasma process. In addition, the $Cl_2$ plasma process, the $N_2$ plasma process, and the $Cl_2/N_2$ plasma process may be combined to form an adsorption-inhibiting region. For example, after performing the $Cl_2$ plasma process, the $N_2$ plasma process may be performed, and then the $Cl_2$ plasma process may be performed, or after performing the $N_2$ plasma process, the $Cl_2$ plasma process is performed, and then $N_2$ plasma may be performed. In addition, for example, after performing the $Cl_2$ plasma process, the $Cl_2/N_2$ plasma process may be performed, and then the $Cl_2$ plasma process may be performed, or after performing the $N_2$ plasma process, the $Cl_2/N_2$ plasma process may be performed, and then the $N_2$ plasma process may be performed. If the process is a combination of the $Cl_2$ plasma process, the $N_2$ plasma process, and the $Cl_2/N_2$ plasma process, it is not limited to the above and it also includes combinations of three or more steps.

The method of forming a silicon film according to an embodiment may further include a modification process. The modification process is performed after at least one of, for example, the process of forming the adsorption-inhibiting region, the Si precursor adsorption process, or the nitriding process. In the modification process S17, the wafer W is exposed to plasma generated from hydrogen gas to modify the Si-containing layer and the SiN film. In the present embodiment, the controller 9 supplies hydrogen gas from the gas supplier 5 into the processing container 1 through the shower head 3, and then supplies RF power to the shower head 3 from the RF power supply 8. As a result, plasma is generated from the hydrogen gas in the processing container 1, and active species such as hydrogen radicals and hydrogen ions are supplied to the surface of the wafer W and into the trench. As a result, the Si-containing film is modified. The modification of the Si-containing film includes, for example, removing halogen contained in the Si-containing film. In the second and subsequent cycles, removing halogens or excess $NH_x$ groups in the SiN film is also included. For example, a wet etching rate can be improved by removing halogens or excess $NH_x$ groups.

EXAMPLES

A description will be made with examples in which embedding characteristics have been evaluated when silicon nitride films were formed in trenches formed in the surfaces of wafers W by the silicon nitride film forming methods of the above-described embodiment.

Figure 2:
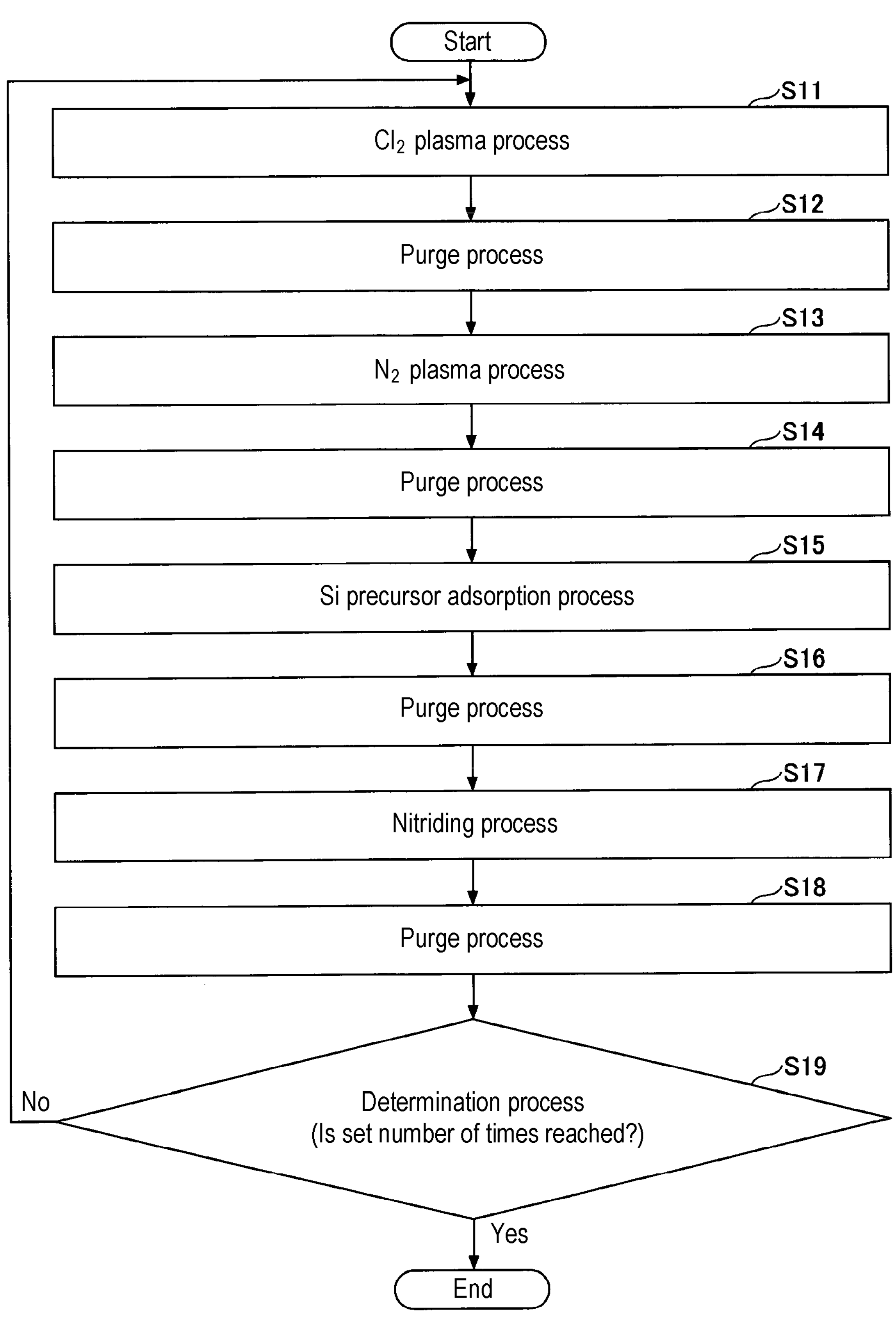
FIG. 2 is a flowchart illustrating an example of a method of forming a silicon nitride film according to an embodiment.
Figure 3:
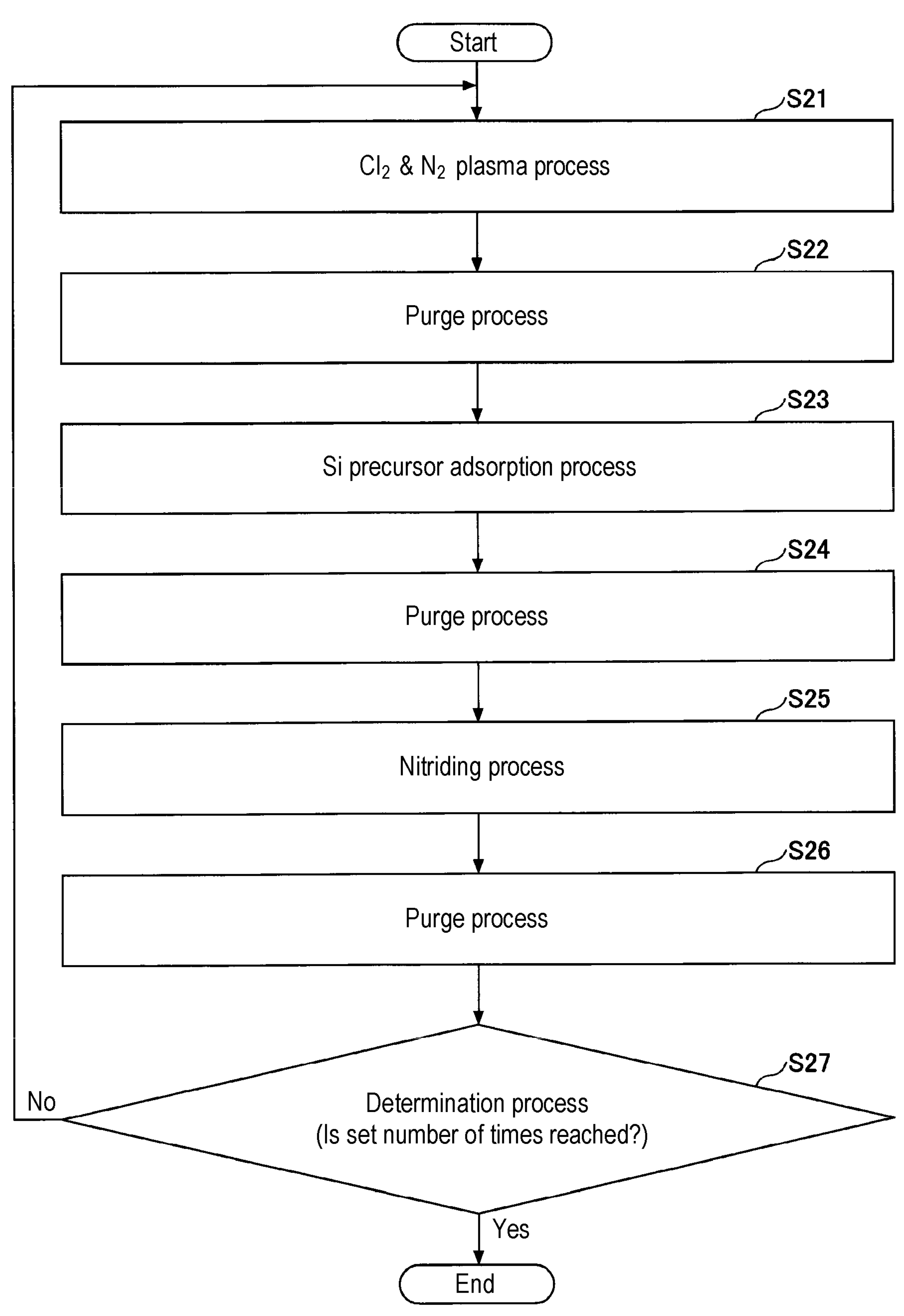
FIG. 3 is a flowchart illustrating another example of a method of forming a silicon nitride film according to an embodiment.

In Example 1, a silicon nitride film was formed in a trench by the silicon nitride film forming method illustrated in FIG. 2. That is, in Example 1, an adsorption-inhibiting region was formed on a wafer W by performing the $Cl_2$ plasma process S11 and the $N_2$ plasma process S13 in this order, and then the Si precursor adsorption process S15 and the nitriding process S17 were performed. Subsequently, six positions Z1 to Z6 were defined from the shallowest side in the trench, and the thickness of the deposited silicon nitride film was measured at each position. In addition, by dividing the measured thickness of the silicon nitride film by the number of repetitions of the processes from the $Cl_2$ plasma process S11 to the purge process S18, a film formation amount per cycle of the silicon nitride film (hereinafter, referred to as "GPC (growth per cycle)") was calculated. In addition, an etching rate (hereinafter, referred to as "WER (wet etching rate)") when the silicon nitride film formed in the trench was etched with 0.5% dilute hydrofluoric acid (DHF) was measured.

Figure 4:
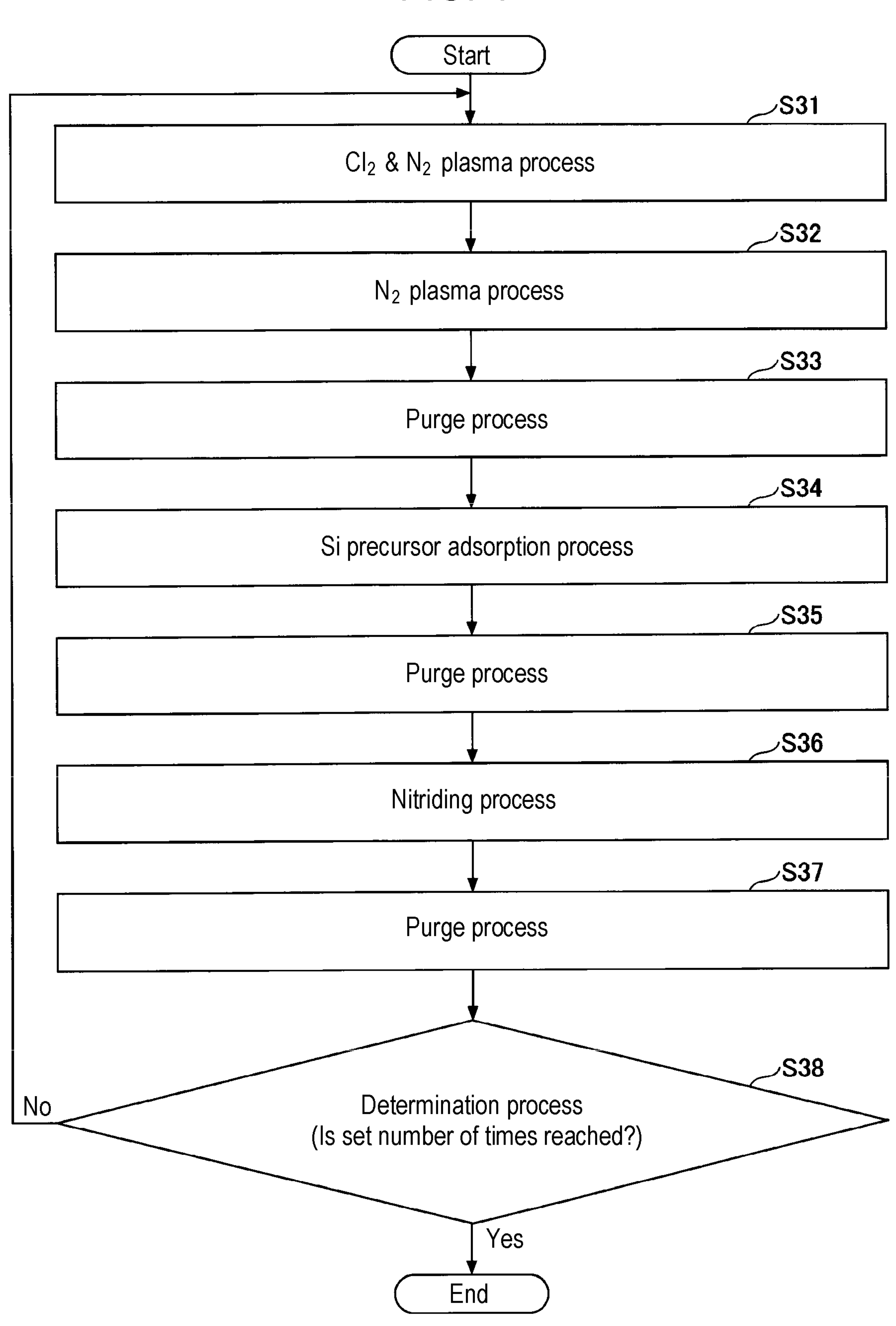
FIG. 4 is a flowchart illustrating yet another example of a method of forming a silicon nitride film according to an embodiment.
Figure 5:
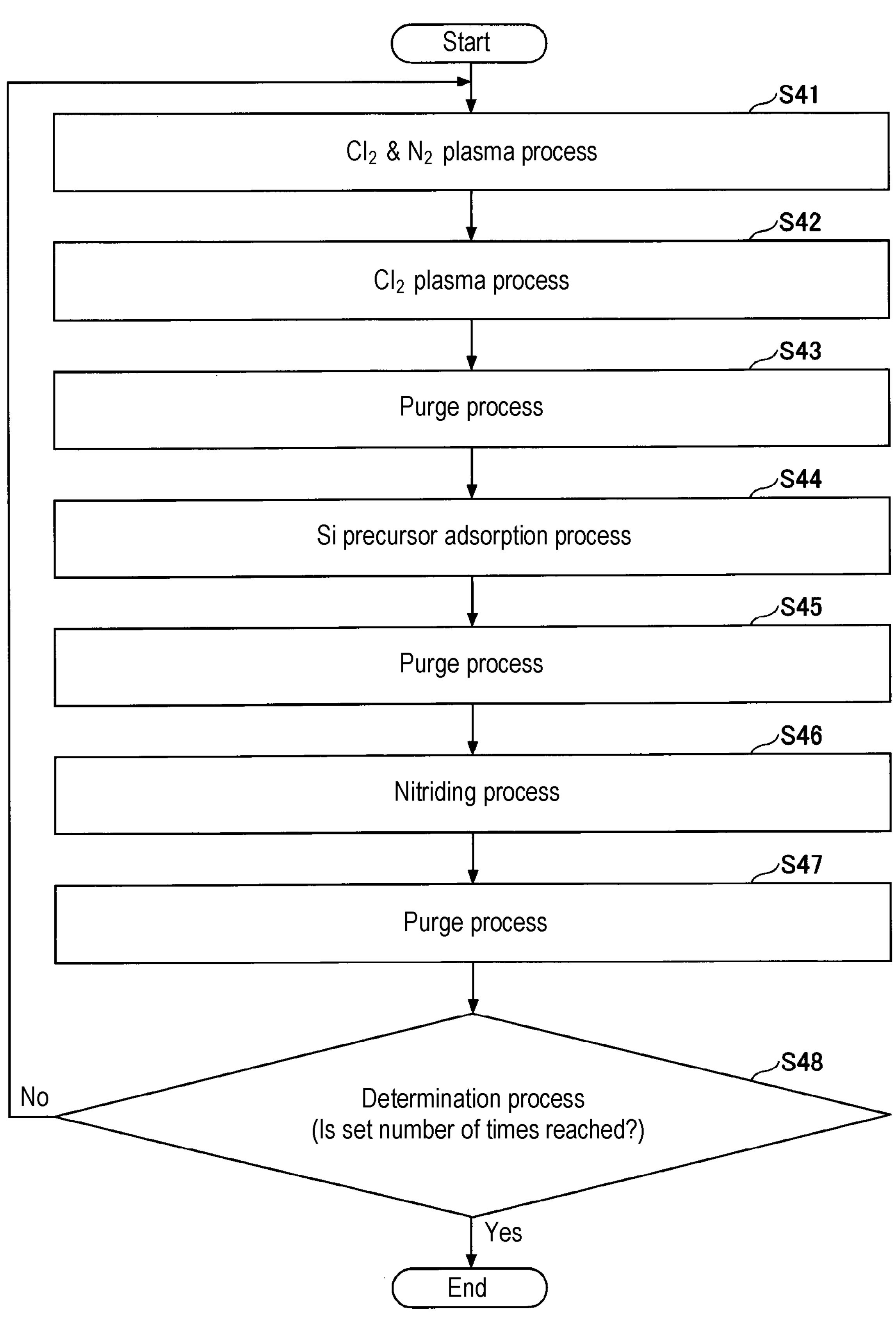
FIG. 5 is a flowchart illustrating still another example of a method of forming a silicon nitride film according to an embodiment.

In Example 2, a silicon nitride film was formed in a trench by the silicon nitride film forming method illustrated in FIG. 4. That is, in Example 2, an adsorption-inhibiting region was formed by performing the $Cl_2/N_2$ plasma process S31 and the $N_2$ plasma process S32 in this order, and then the Si precursor adsorption process S34 and the nitriding process S36 were performed. Subsequently, six positions Z1 to Z6 were defined from the shallowest side in the trench, the thickness of the silicon nitride film was measured at each of the positions, and the GPC was calculated by dividing the measured thickness by the number of repetitions of the processes from the $Cl_2/N_2$ plasma process S31 to the purge process S37. In addition, the WER was measured when the silicon nitride film formed in the trench was etched with 0.5% DHF.

In Comparative Example 1, a silicon nitride film was formed in a trench without performing the $N_2$ plasma process S13 and the purge process S14 in the silicon nitride film forming method illustrated in FIG. 2. That is, in Comparative Example 1, the Si precursor adsorption process S15 and the nitriding process S17 were performed after exposing the wafer W to plasma generated from chlorine gas to form an adsorption-inhibiting region. Subsequently, six positions Z1 to Z6 were defined from the shallowest side in the trench, the thickness of the silicon nitride film was measured at each of the positions, and the GPC was calculated by dividing the measured thickness by the number of repetitions of the processes from the $Cl_2$ plasma process S11 to the purge process S18. In addition, the WER was measured when the silicon nitride film formed in the trench was etched with 0.5% DHF.

In Comparative Example 2, a silicon nitride film was formed in a trench without performing the $Cl_2$ plasma process S11 and the purge process S12 in the silicon nitride film forming method illustrated in FIG. 2. That is, in Comparative Example 2, the Si precursor adsorption process S15 and the nitriding process S17 were performed after exposing the wafer W to plasma generated from nitrogen gas to form an adsorption-inhibiting region. Subsequently, six positions Z1 to Z6 were defined from the shallowest side in the trench, the thickness of the silicon nitride film was measured at each of the positions, and the GPC was calculated by dividing the measured thickness by the number of repetitions of the processes from the $N_2$ plasma process S13 to the purge process S18.

Figure 7:
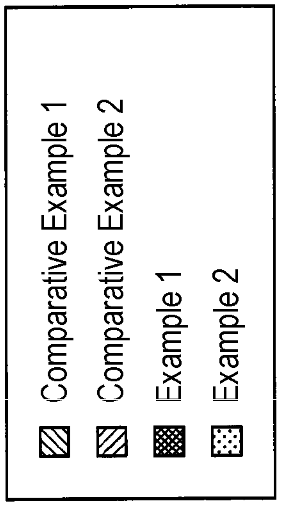
FIG. 7 is a diagram showing evaluation results of embedding characteristics of silicon nitride films in trenches.
Figure 7:
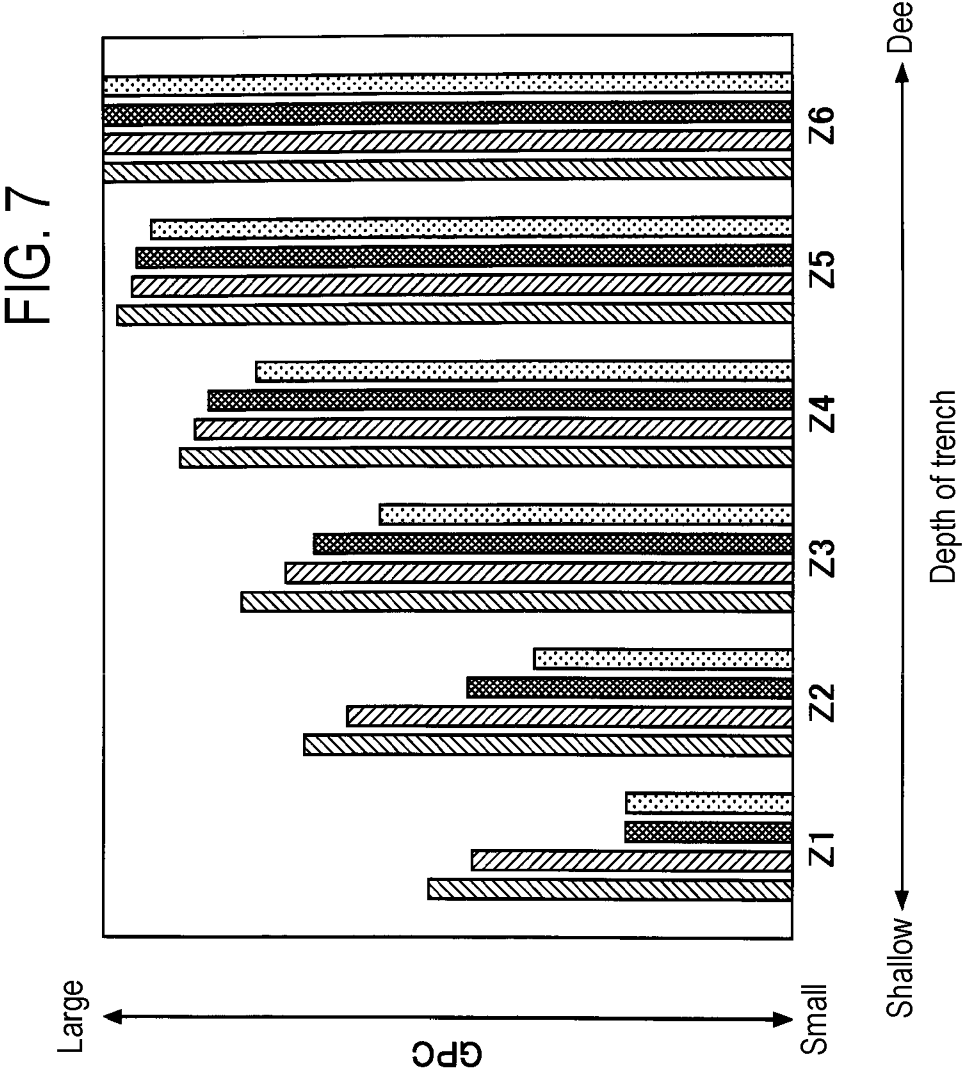

FIG. 7 is a diagram showing evaluation results of embedding characteristics of silicon nitride films in trenches. In FIG. 7, among the positions Z1 to Z6, the position Z1 is the shallowest position, i.e., the position of the top portion in the trench, and the position Z6 is the deepest position, i.e., the position of the bottom portion in the trench. FIG. 7 also shows normalized GPCs at the position Z6 in all of Example 1, Example 2, Comparative Example 1, and Comparative Example 2.

As shown in FIG. 7, in any of Example 1, Example 2, Comparative Example 1, and Comparative Example 2, it can be seen that the cycle rate decreases when proceeding from the position Z6 to the position Z1 (from the bottom to the top of the trench). From such results, it was shown that the silicon nitride film can be formed while forming a V-shaped cross section in any of Examples 1 and 2 and Comparative Examples 1 and 2.

In addition, it can be seen that in Examples 1 and 2, compared to Comparative Examples 1 and 2, the GPCs in the top portions in the trenches (the positions where the trenches are shallow) are particularly small. From such results, it was shown that compared to Comparative Example 1 and Comparative Example 2, in Example 1 and Example 2, the V-shaped opening angle of a cross section of a silicon nitride film embedded in a trench can be increased, and the silicon nitride film can be formed with a high bottom-up property.

As described above, according to Examples 1 and 2, since a silicon nitride film can be formed with a high bottom-up property, generation of voids can be suppressed more effectively. Furthermore, since the aspect ratio within a pattern can be kept relatively low, radicals can be more easily supplied to a seam. Therefore, it is considered that a high-quality silicon nitride film can be embedded in a trench, and, for example, wet etching resistance is improved. In particular, it has been known that, when forming a silicon nitride film at a low temperature (e.g., less than 400 degrees C.), insufficient nitriding is likely to occur, and wet etching is likely to proceed with the seam as a starting point. In Examples 1 and 2, it is considered that since the aspect ratio in a pattern can be kept relatively low, high wet etching resistance is achieved even at a low temperature. In addition, even when the bowing shape of a trench is large, it is considered that the generation of voids can be suppressed more effectively.

Figure 8:
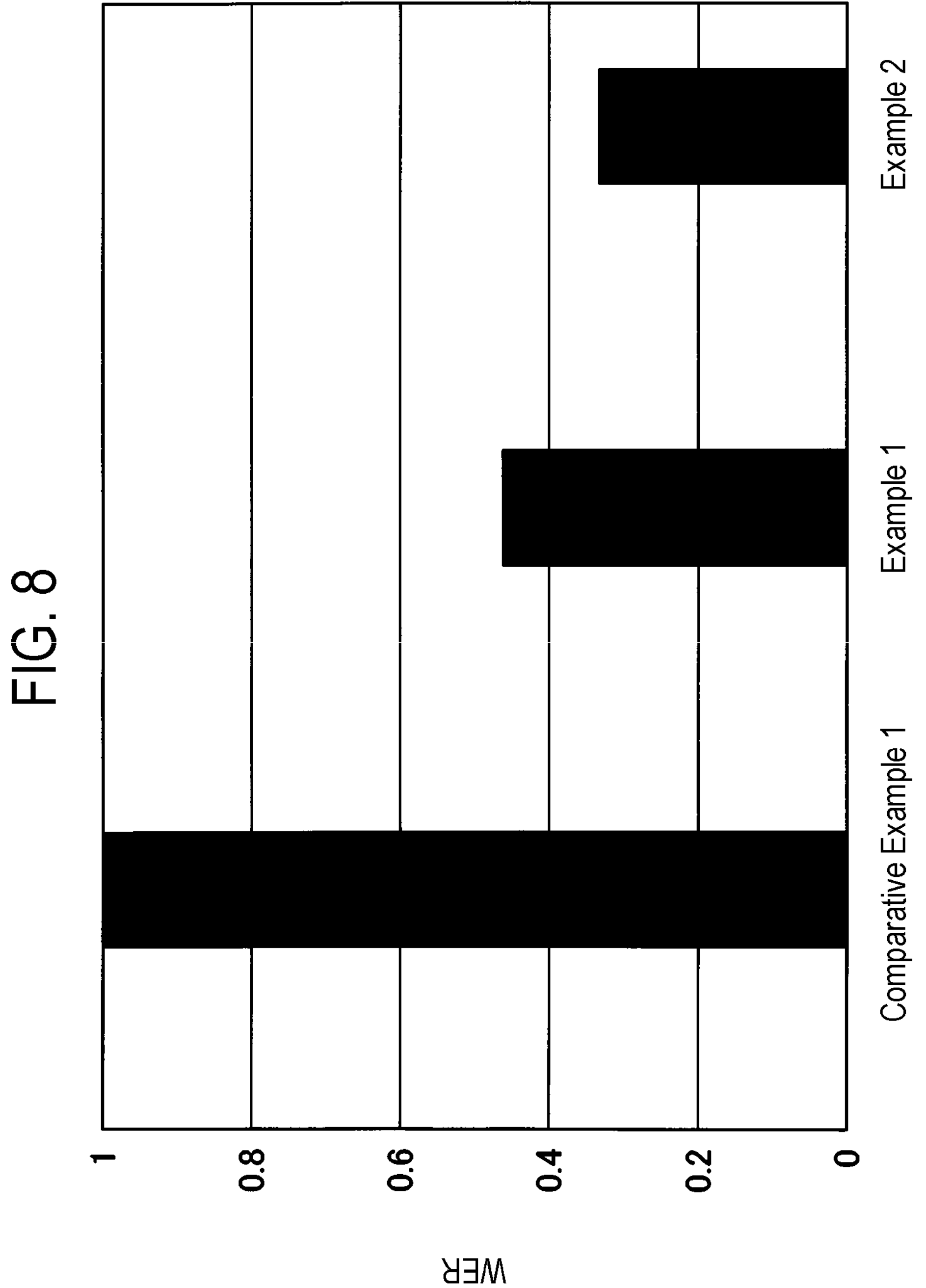
FIG. 8 is a diagram showing WER evaluation results of silicon nitride films embedded in trenches.

FIG. 8 is a diagram showing evaluation results of the wet etching rates (WERs) of the silicon nitride films embedded in the trenches. FIG. 8 shows the wet etching rates (WERs) of Example 1, Example 2, and Comparative Example 1 when normalized by the wet etching rate (WER) of Comparative Example 1.

As shown in FIG. 8, the wet etching rates (WERs) of Examples 1 and 2 are less than half the wet etching rate (WER) of Comparative Example 1. The results show that in Examples 1 and 2, improved wet etching resistance is achieved compared to Comparative Example 1. In particular, the wet etching rate (WER) of Example 2 was about ⅓ of the wet etching rate (WER) of Comparative Example 1, indicating that the wet etching resistance was particularly improved.

It is to be considered that the embodiments disclosed herein are exemplary in all respects and not restrictive. The above-described embodiments may be omitted, replaced, or modified in various forms without departing from the scope and spirit of the appended claims.

In the above-described embodiments, the cases where the film forming apparatus is a capacitively coupled plasma apparatus have been described, but the present disclosure is not limited thereto. For example, the film forming apparatus may be plasma apparatus using inductively coupled plasma, surface wave plasma (microwave plasma), magnetron plasma, remote plasma, or the like as a plasma source.

In the above-described embodiments, the cases where the film forming apparatus is a single-wafer-type apparatus for processing wafers one by one have been described, but the present disclosure is not limited thereto. For example, the film forming apparatus may be a batch-type apparatus that processes a plurality of wafers at once. In addition, for example, the film forming apparatus may be a semi-batch-type apparatus that causes a plurality of wafers placed on a turntable within a processing container to revolve by the turntable such that the wafers sequentially pass through a region to which a first gas is supplied and a region to which a second gas is supplied, thereby processing the wafers. Furthermore, for example, the film forming apparatus may be a multi-single-wafer-type film forming apparatus that includes a plurality of stages in a single processing container.

The present international application claims priority based on Japanese Patent Application No. 2021-007406 filed on Jan. 20, 2021, the disclosure of which is incorporated herein in its entirety by reference.

EXPLANATION OF REFERENCE NUMERALS

1: a processing container, 5: gas supplier, 9: controller

What is claimed is:

1. A method of forming a silicon nitride film in a recess formed in a surface of a substrate, the method comprising:

forming an adsorption-inhibiting region by exposing the substrate to plasma generated from an adsorption-inhibiting gas that contains a halogen gas and a non-halogen gas;

adsorbing a silicon-containing gas in a region other than the adsorption-inhibiting region; and forming the silicon nitride film by exposing the substrate, on which the silicon-containing gas has been adsorbed, to plasma generated from a nitrogen-containing gas.

2. The method of claim 1, wherein a cycle comprising the forming the adsorption-inhibiting region, the adsorbing the silicon-containing gas, and the forming the silicon nitride film is repeated.

3. The method of claim 2, wherein the forming the adsorption-inhibiting region comprises exposing the substrate to plasma generated from the halogen gas and then exposing the substrate to plasma generated from the non-halogen gas.

4. The method of claim 3, wherein the forming the adsorption-inhibiting region comprises exposing the substrate to the plasma generated from the halogen gas, then exposing the substrate to the plasma generated from the non-halogen gas, and then exposing the substrate to the plasma generated from the halogen gas.

5. The method of claim 4, wherein power supplied to generate plasma in the forming the adsorption-inhibiting region is smaller than power supplied to generate plasma in the forming the silicon nitride film.

6. The method of claim 5, wherein a temperature of the substrate is set to 600 degrees C. or lower.

7. The method of claim 6, wherein the halogen gas is chlorine gas, and the non-halogen gas is nitrogen gas.

8. The method of claim 7, further comprising:

modifying the substrate by exposing the substrate to plasma generated from hydrogen gas.

9. The method of claim 8, wherein the modifying is performed after at least any one of the forming the adsorption-inhibiting region, the adsorbing the silicon-containing gas, and the forming the silicon nitride film.

10. The method of claim 1, wherein the forming the adsorption-inhibiting region comprises exposing the substrate to plasma generated from the halogen gas and then exposing the substrate to plasma generated from the non-halogen gas.

11. The method of claim 1, wherein the forming the adsorption-inhibiting region comprises exposing the substrate to plasma generated from the non-halogen gas and then exposing the substrate to plasma generated from the halogen gas.

12. The method of claim 11, wherein the forming the adsorption-inhibiting region comprises exposing the substrate to the plasma generated from the non-halogen gas, then exposing the substrate to the plasma generated from the halogen gas, and then exposing the substrate to the plasma generated from the non-halogen gas.

13. The method of claim 1, wherein the forming the adsorption-inhibiting region comprises exposing the substrate to plasma generated from the halogen gas and the non-halogen gas.

14. The method of claim 13, wherein the forming the adsorption-inhibiting region comprises exposing the substrate to the plasma generated from the halogen gas and the non-halogen gas, and then exposing the substrate to plasma generated from one of the halogen gas and the non-halogen gas.

15. The method of claim 1, wherein the forming the adsorption-inhibiting region comprises exposing the substrate to plasma generated from one of the halogen gas and the non-halogen gas, and then exposing the substrate to plasma generated from the halogen gas and the non-halogen gas.

16. The method of claim 1, wherein the forming the adsorption-inhibiting region comprises:

exposing the substrate to plasma generated from the halogen gas and the non-halogen gas;

exposing the substrate to plasma generated from one of the halogen gas and the non-halogen gas; and exposing the substrate to plasma generated from the one or the other of the halogen gas and the non-halogen gas.

17. The method of claim 1, wherein power supplied to generate plasma in the forming the adsorption-inhibiting region is smaller than power supplied to generate plasma in the forming the silicon nitride film.

18. The method of claim 1, wherein a temperature of the substrate is set to 600 degrees C. or lower.

19. The method of claim 1, wherein the halogen gas is chlorine gas, and the non-halogen gas is nitrogen gas.

20. A film forming apparatus comprising:

a processing container configured to accommodate a substrate having a recess formed in a surface thereof;

a gas supplier configured to supply an adsorption-inhibiting gas, a silicon-containing gas, and a nitrogen-containing gas into the processing container; and a controller, wherein the adsorption-inhibiting gas contains a halogen gas and a non-halogen gas, and wherein the controller is configured to control the gas supplier to execute:

forming an adsorption-inhibiting region by exposing the substrate to plasma generated from the adsorption-inhibiting gas;

adsorbing the silicon-containing gas in a region other than the adsorption-inhibiting region; and forming a silicon nitride film by exposing the substrate, on which the silicon-containing gas has been adsorbed, to plasma generated from the nitrogen-containing gas.

* * * * *